(12) United States Patent
Shimasaki

(10) Patent No.: US 6,462,642 B1
(45) Date of Patent: Oct. 8, 2002

(54) HIGH-VOLTAGE VARIABLE RESISTOR

(75) Inventor: Fumihiko Shimasaki, Nagaokakyko (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/994,654

(22) Filed: Nov. 28, 2001

(30) Foreign Application Priority Data

Dec. 1, 2000 (JP) .................................. 2000-367061

(51) Int. Cl.[7] .................................................. H01C 10/32
(52) U.S. Cl. .......................... 338/162; 338/184; 338/189
(58) Field of Search ................................ 338/160, 162, 338/128, 129, 131, 184, 199, 118

(56) References Cited

U.S. PATENT DOCUMENTS 5,929,745 A * 7/1999 Tsunezawa et al. .......... 338/160
6,200,156 B1 * 3/2001 Hiraki et al. ................. 338/162

FOREIGN PATENT DOCUMENTS

JP 11-121212 4/1999

* cited by examiner

Primary Examiner—Karl D. Easthom
(74) Attorney, Agent, or Firm—Keating & Bennett LLP

(57) ABSTRACT

A high voltage variable resistor includes a variable resistance board, a substantially rectangular flat fixed-resistance board, and a high-voltage capacitor housed in a case such that one surface thereof is open. The fixed-resistance board is arranged such that a longer side extends from the bottom surface to the opening surface of the case.

12 Claims, 3 Drawing Sheets

HIGH-VOLTAGE VARIABLE RESISTOR

BACKGROUND OF THE INVENTION

1. Field of the Invention

The present invention relates to a high-voltage variable resistor for adjustment of focusing voltages and screen-grid voltages in television receivers, and other suitable apparatuses.

2. Description of the Related Art

A conventional high-voltage variable resistor includes a variable resistance board having a variable resistor portion and a fixed-resistance board having a fixed-resistance portion of bleeder resistors, etc., disposed thereon and a housing containing the same. See, for example, Japanese Unexamined Patent Application Publication No. 11-121212. This high-voltage variable resistor is provided with an insulating case that has one surface which is open, a panel wall in the shape of an "L" is provided inside the case, a first housing portion and a second housing portion which are divided by the panel wall are provided, a rectangular flat variable resistance board, on the surface of which a resistance pattern containing an arc-shaped variable resistor portion is disposed, is housed in the first housing portion, and a rectangular flat fixed-resistance board having longer and shorter sides, on the surface of which a fixed-resistance pattern is formed, and a high-voltage capacitor are housed in the second housing portion.

The variable resistance board is disposed such that its front surface faces the bottom surface of the case, and the rear side is filled with an insulation resin. The fixed-resistance board is arranged such that its shorter side extends from the bottom surface to the opening surface side of the case and that its longer side is parallel to the opening surface and the bottom surface of the case. In this high-voltage variable resistor, the second housing portion is constructed to surround the first housing portion so that the longer side of the fixed-resistance board is effectively disposed in the case. The thus constructed high-voltage variable resistor joined to a fly-back transformer (hereinafter referred to as an FBT) is put in the case, and the whole area on the side of the opening surface of the case is filled with the same resin as in the FBT.

As described above, in the conventional high-voltage variable resistor, the fixed-resistance board is disposed such that its longer side is parallel to the opening surface of the case, and it is necessary to provide an area in a top view when looked at from the opening surface of the case such that the longer side of the fixed-resistance board can be housed inside the case. As a result, the size of the case in a top view when looked at from the opening surface is restricted by the dimension of the longer side of the fixed-resistance board, and it is very difficult to reduce the size of the case. That is, since it is required to set the size of the case in accordance with the dimension of the longer side of the fixed-resistance board, miniaturization of the case, that is, miniaturization of the high-voltage variable resistor is prevented.

SUMMARY OF THE INVENTION

In order to overcome the problems described above, preferred embodiments of the present invention provide a high-voltage variable resistor that has a greatly reduced size achieved by disposing a fixed-resistance board such that its longer side extends from the bottom surface to the opening surface of a case.

According to a preferred embodiment of the present invention, a high-voltage variable resistor includes a variable resistance board having a resistance pattern including a variable resistor disposed thereon, a substantially rectangular flat fixed-resistance board having longer and shorter sides and a fixed-resistance pattern disposed thereon, and a case having an opening at one surface thereof. In the high-voltage variable resistor, the variable resistance board and the fixed-resistance board are housed in the case, and the fixed-resistance board is arranged such that the longer side of the fixed-resistance board extends from the bottom surface to the opening surface of the case.

According to the unique construction and arrangement of this preferred embodiment, since the fixed-resistance board is arranged such that the shorter side of the fixed-resistance board can be housed inside the case and, without the dimension of the longer side of the fixed-resistance board being restricted, the side of the case can be set in accordance with the dimension of the shorter side of the fixed-resistance board. As a result, the case can be made smaller as compared with conventional device. That is, it is enough to acquire an area in a top view of the case when looked at from the opening surface of the case such that the shorter side of the fixed-resistance board can be housed in the case. Furthermore, since the arrangement of the elements inside the case can be determined in accordance with the dimension of the shorter side of the fixed-resistance board, the case can be much smaller than conventional ones.

Furthermore, because of such miniaturization, the material cost of the case is greatly reduced, and the amount of resin to be used at the connection location of the high-voltage variable resistor to the FBT can be also reduced, and accordingly the cost reduction of the high-voltage variable resistor is further achieved.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
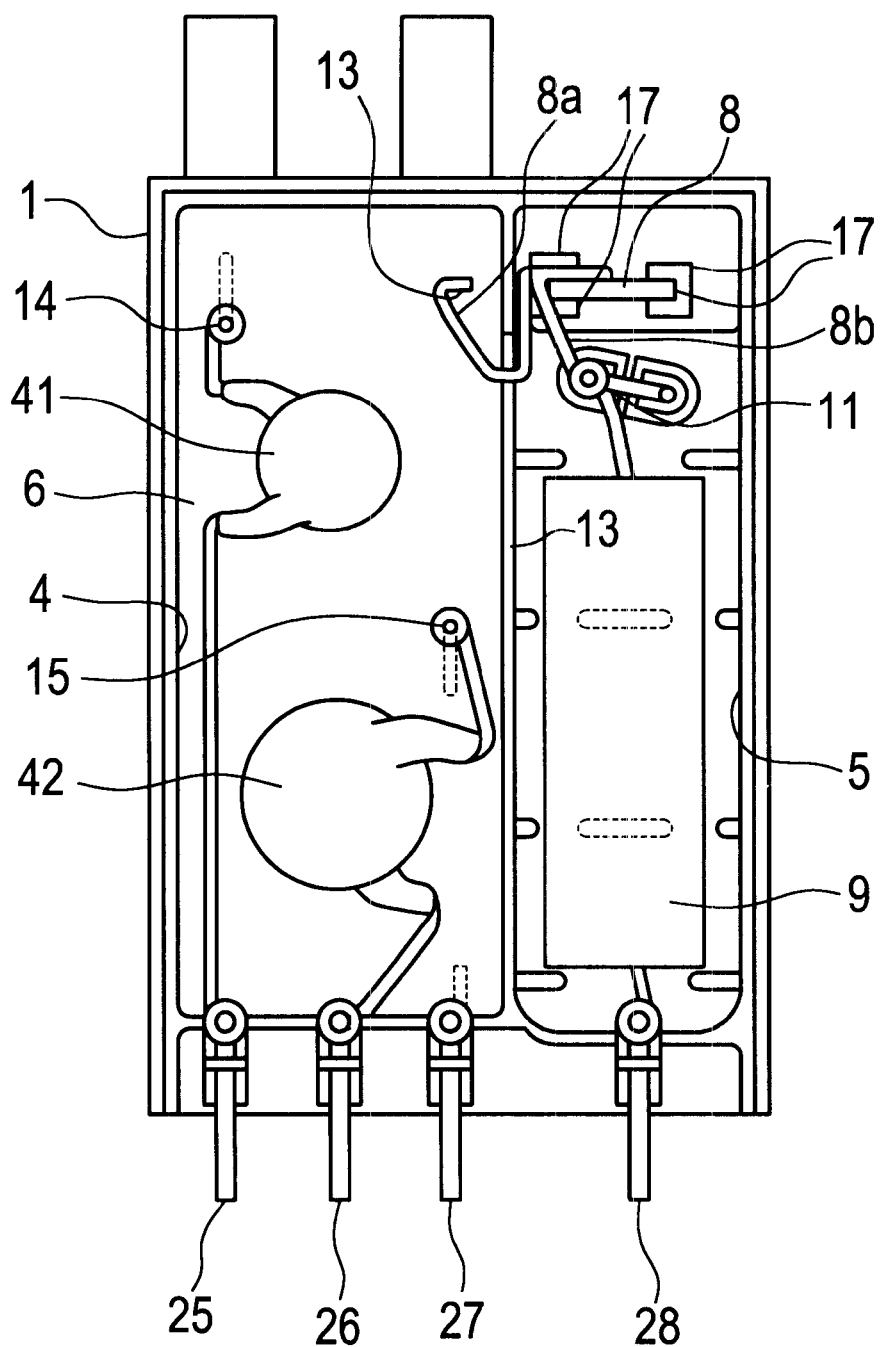
FIG. 1 is a rear view of a high-voltage variable resistor according to a preferred embodiment of the present invention.
Figure 2:
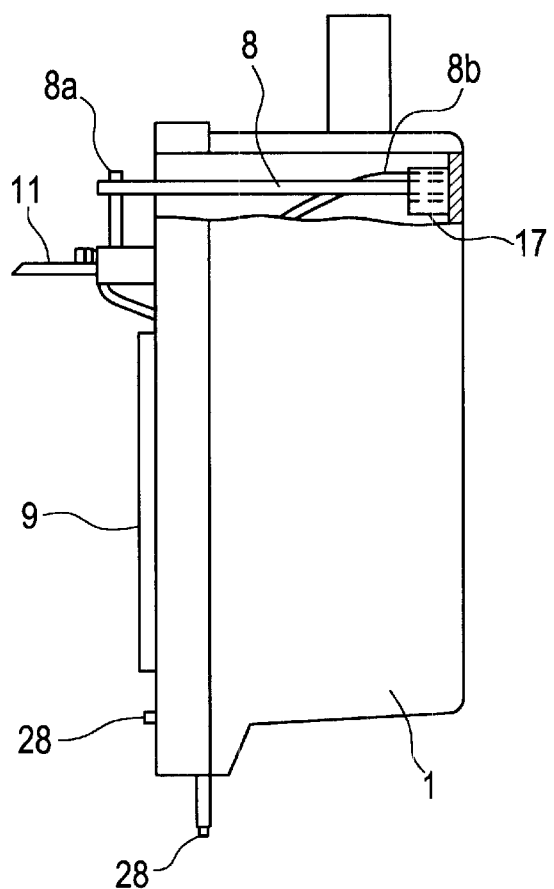
FIG. 2 is a side view of the high-voltage variable resistor in FIG. 1.
Figure 3:
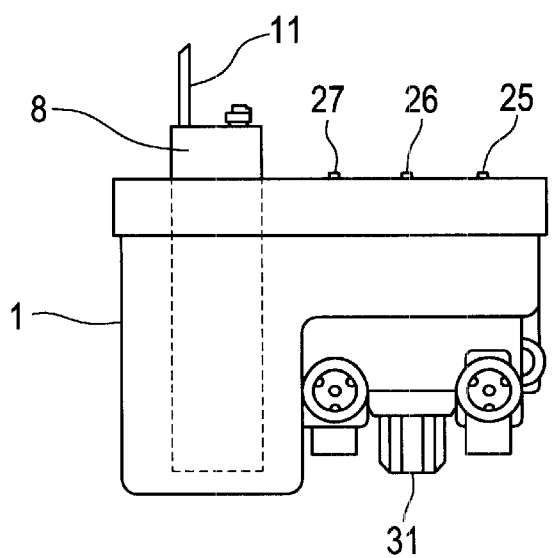
FIG. 3 is a top view of the high-voltage variable resistor in FIG. 1.
Figure 4:
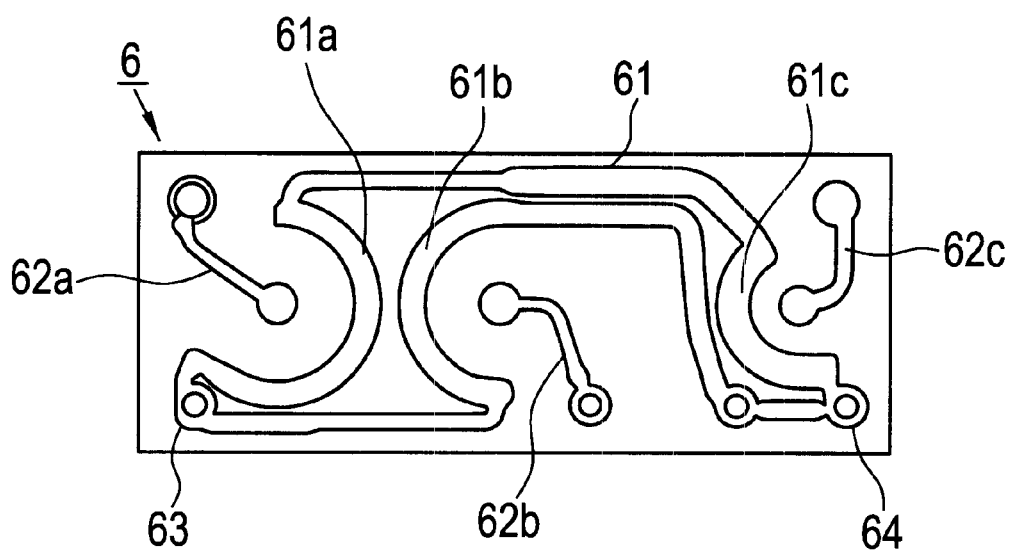
FIG. 4 is a top view of a variable resistance board according to a preferred embodiment of the present invention.
Figure 5:
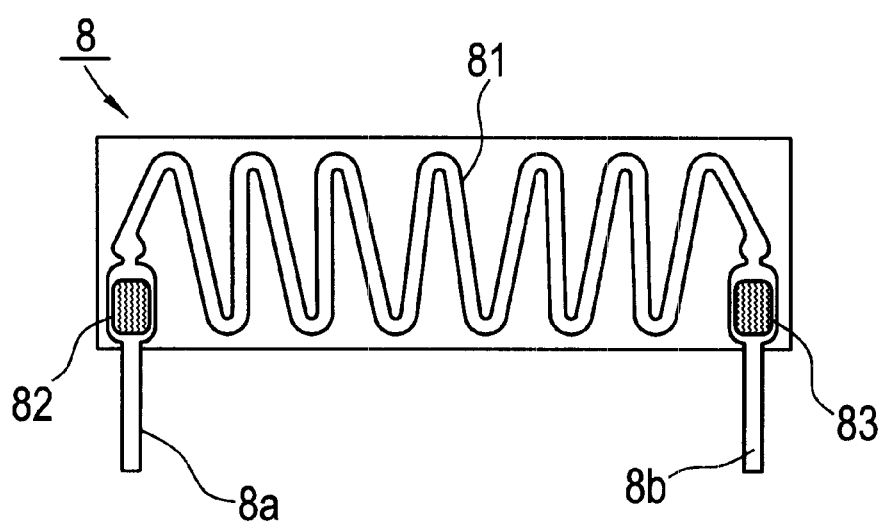
FIG. 5 is a top view of a fixed-resistance board according to a preferred embodiment of the present invention.

The construction of a high-voltage variable resistor according to a preferred embodiment of the present invention is described with reference to FIGS. 1 to 3. FIG. 1 is a rear view of a high-voltage variable resistor, FIG. 2 is a side view of the high-voltage variable resistor in FIG. 1, FIG. 3 is a top view of the high-voltage variable resistor in FIG. 1, which is seen from above, FIG. 4 is a top view of a variable resistance board according to the present preferred embodiment, and FIG. 5 is a top view of a fixed-resistance board according to the present preferred embodiment. Moreover, in FIG. 2, a broken view of a portion of the high-voltage variable resistor is shown, and, in FIG. 3, a portion of the fixed-resistance board inside a case is shown by a broken line.

The high-voltage variable resistor is provided with a case 1 having an opening at one surface thereof. More particularly, the side of the rear surface is made open. The case 1 is preferably made of an insulating resin material such as polybutylene terephthalate, polyphenylene oxide, or other suitable material. In the case 1, a first housing portion 4 having a substantially rectangular shape and a second housing portion 5 having a substantially rectangular shape, both of which are divided by a straight panel wall, are arranged close to each other in a row arrangement. In the first housing portion 4, a variable resistance board 6 having a substantially rectangular shape, on the surface of which a resistor pattern and terminal electrodes are provided, is housed so that the front surface of the variable resistance board 6 faces the bottom surface of the case 1, and a molded insulating resin layer (not illustrated) preferably made of epoxy resin or other suitable material, is arranged so as to cover the rear surface of the variable resistance board 6 in the first housing portion 4. A static capacitor 41 and a dynamic capacitor 42 are disposed on the rear side of the insulating resin layer. A bleeder fixed-resistance board 8 and a smoothing high-voltage capacitor 9 are housed in the second housing portion 5.

The variable resistance board 6 is preferably made of an insulating, substantially rectangular flat board of alumina or other suitable material, and, as shown in FIG. 4, a resistor pattern 61 having a first variable resistor portion 61a, which is arc-shaped, for focusing voltage adjustment, a second variable resistor portion 61b, which is arc-shaped, for focusing voltage adjustment, and a variable resistor portion 61c, which is arc-shaped, for screen-grid voltage adjustment are disposed on one main surface (top surface) and output electrode patterns 62a, 62b, and 62c corresponding to the variable resistor portions 61a, 61b, and 61c, respectively, are provided. A high-voltage input terminal 63 and a grounding terminal electrode 64 are disposed at fixed locations of the resistor pattern 61.

The fixed-resistance board 8 is preferably made of an insulating, substantially rectangular flat board having longer and shorter sides, and, as shown in FIG. 5, a meandering fixed-resistance pattern 81 is disposed on one main surface (top surface) and terminal electrodes 82 and 83 are disposed at fixed locations of the fixed-resistance pattern 81, and lead wires 8a and 8b are connected to the terminal electrodes 82 and 83 by soldering or other suitable connection. As required, the whole fixed-resistance board 8, the surface of which the resistance pattern 81 is disposed or the resistance pattern 81 itself, is covered by a packaging resin such as epoxy resin or other suitable material.

The fixed-resistance board 8 is arranged such that its longer sides extend from the bottom surface to the opening surface of the case 1. That is, the longer sides and the main surface (top surface) of the fixed-resistance board 8 are arranged to be substantially perpendicular to the opening surface. More specifically, the fixed-resistance board 8 is arranged such that one shorter side of the fixed-resistance board 8 is inserted in the fixing slots 17 provided on the bottom surface of the case 1, and the other shorter side is positioned on the opening surface side.

The fixed-resistance board 8 of the present preferred embodiment preferably has dimensions of, for example, about 8 mm of the shorter side, 30 mm of the longer side, and about 1 mm of the thickness, and the shorter side on the opening surface side is protruded from the opening surface. This protruded portion is housed in the FBT such that the fixed-resistance board 8 is mounted in the FBT. That is, when the fixed-resistance board is protruded from the opening surface of the case in this way, a space for housing the protruded portion is provided in the FBT where the high-voltage variable resistor is mounted. Moreover, an instance where the fixed-resistance board is protruded from the opening surface of the case is shown in the present preferred embodiment, but a construction where the fixed-resistance board is not protruded from the opening surface of the case may be adopted.

One lead wire 8a of the fixed-resistance board 8 is connected to a focusing input terminal 13 provided in the variable resistance board 6, and the other lead wire 8b is connected to an FBT connection terminal 11 which is fixed in the case 1. One lead wire of the high-voltage capacitor 9 is connected to an external connection terminal 28 to be described later, and the other terminal is connected to the FBT connection terminal 11. When the high-voltage variable resistor is joined to the FBT, the FBT connection terminal 11 is electrically connected to the output portion of the FBT and a high direct-current voltage is input to the FBT connection terminal 11 from the FBT.

In the side wall at one end (bottom surface in FIG. 1) of the case 1, round stick-like external connection terminals 25 to 28, which are preferably substantially L-shaped, are fixed so as to protrude from the side wall. One lead wire of the focusing static capacitor 41 is connected to the external connection terminal 25, and the other lead wire is connected to a first focusing terminal 14 protruded from the rear side of the variable resistance board 6. One lead wire of the focusing dynamic capacitor 42 is connected to the external connection terminal 26, and the other lead wire is connected to a second focusing output terminal 15. The external connection terminal 27 is a grounding terminal and is connected to the grounding electrode in the variable resistance board 6 by a lead wire. The connection of each lead wire and each terminal described above is such that the lead wire is wound round the terminal and soldered. Moreover, the connection between each lead wire and each terminal is not limited to soldering.

Three rotating shafts 31 for adjustment of resistance are protruded out of the bottom surface of the case 1, a slider (not illustrated) is attached at the tip portion of each of the rotating shafts inside the case, and the slider is constructed so as to slide over the arc-shaped variable resistor portion of a resistance pattern disposed on the surface of the variable resistance board. In the present preferred embodiment, the two rotating shafts for focusing voltage adjustment and the one rotating shaft for screen-grid voltage adjustment are provided.

The side of the opening portion of the high-voltage variable resistor is joined to the FBT, and the whole area on the side of the opening portion of the case 1 including the surrounding space of the fixed-resistance board 8 and the high-voltage capacitor 9 is filled with the same resin as in the FBT.

As described above, in the present preferred embodiment, since the fixed-resistance board 8 is disposed such that the longer side extends from the bottom surface to the opening surface of the case 1, the size of the case 1 can be set to meet the shorter side of the fixed-resistance board 8. That is, it becomes possible to dispose the fixed-resistance board 8, the variable resistance board 6, and the high-voltage capacitor 9 so that the shorter side of the fixed-resistance board 8 can be housed inside the case 1, and the case 1 can be made smaller, compared with the conventional one where the longer side of the fixed-resistance board is to be housed. Accordingly, the high-voltage variable resistor can be much smaller.

Furthermore, with such miniaturization, the material cost of the case and the amount of resin to be used at the connection location of the high-voltage variable resistor to the FBT can be reduced, and the cost in the combination of the high-voltage variable resistor and the FBT can be greatly reduced.

Moreover, the present invention is not limited to the construction of the above-described preferred embodiments, and the present invention can be applied to a high-voltage variable resistor where at least one fixed-resistance board is housed in the case. The present invention can be applied to a construction where no high-voltage capacitor is housed, for example, and to a construction where one focusing voltage or one screen-grid voltage is output. Furthermore, the fixed-resistance board is not limited to the one surface that is covered by an external resin.

As described above, according to the present invention, the fixed-resistance board is disposed such that the shorter side of the fixed-resistance board can be housed in the case and, without any restriction of the dimension of the longer side of the fixed-resistance board, the size of the case can be set in accordance with the dimension of the shorter side of the fixed-resistance board and, as a result, the case can be much smaller. Therefore, the high-voltage variable resistor can be much smaller. Furthermore, the material cost of the case and the amount of resin to be used at the connection location of the high-voltage variable resistor to the FBT can be reduced, and the cost can be reduced in the construction of the high-voltage variable resistor and the FBT.

While preferred embodiments of the present invention have been described above, variations thereto will occur to those skilled in the art within the scope of the present inventive concepts, which are delineated by the following claims.

What is claimed is:

1. A high-voltage variable resistor comprising:
    a variable resistance board having a resistance pattern including a variable resistor disposed thereon;
    a fixed-resistance board having longer and shorter sides and a fixed-resistance pattern disposed thereon; and
    a case having an opening at one surface thereof, wherein the variable resistance board and the fixed-resistance board are housed in the case, and wherein the fixed-resistance board is arranged such that the longer side of the fixed-resistance board extends from the bottom surface side to the opening surface side of the case.

2. A high-voltage variable resistor according to claim 1, wherein the opening in the case is located at a rear surface thereof.

3. A high-voltage variable resistor according to claim 1, wherein the case is made of an insulating resin material.

4. A high-voltage variable resistor according to claim 1, wherein the case includes a first housing portion having a substantially rectangular shape and a second housing portion having a substantially rectangular shape.

5. A high-voltage variable resistor according to claim 1, further comprising a panel wall arranged to divide the first and second housing portions.

6. A high-voltage variable resistor according to claim 2, wherein the variable resistance board is disposed in the first housing portion such that the front surface of the variable resistance board faces the bottom surface of the case.

7. A high-voltage variable resistor according to claim 6, further comprising a molded insulating resin layer arranged to cover the rear surface of the variable resistance board in the first housing portion.

8. A high-voltage variable resistor according to claim 7, further comprising a static capacitor and a dynamic capacitor disposed on the insulating resin layer.

9. A high-voltage variable resistor according to claim 4, further comprising a bleeder fixed-resistance board and a smoothing high-voltage capacitor housed in the second housing portion.

10. A high-voltage variable resistor according to claim 1, wherein the variable resistance board comprises an insulating, substantially rectangular flat board made of alumina.

11. A high-voltage variable resistor according to claim 1, wherein the fixed-resistance board comprises an insulating, substantially rectangular flat board.

12. A high-voltage variable resistor according to claim 1, wherein external connection terminals are disposed on a side wall of the case.

* * * * *